(12) United States Patent
Ro

(10) Patent No.: US 11,551,940 B2
(45) Date of Patent: Jan. 10, 2023

(54) ROLLER FOR CLEANING WAFER AND CLEANING APPARATUS HAVING THE SAME

(71) Applicant: XIA TAI XIN SEMICONDUCTOR (QING DAO) LTD., Qingdao (CN)

(72) Inventor: Yong-Seok Ro, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 514 days.

(21) Appl. No.: 16/661,950

(22) Filed: Oct. 23, 2019

(65) Prior Publication Data
US 2020/0203191 A1 Jun. 25, 2020

Related U.S. Application Data

(60) Provisional application No. 62/784,762, filed on Dec. 25, 2018.

(51) Int. Cl.
| | | |
|---|---|---|
| H01L 21/67 | (2006.01) | |
| B08B 11/02 | (2006.01) | |
| H01L 21/02 | (2006.01) | |
| B08B 3/02 | (2006.01) | |
| B08B 1/00 | (2006.01) | |
| B08B 1/04 | (2006.01) | |
| A46B 13/00 | (2006.01) | |

(52) U.S. Cl.
CPC ...... *H01L 21/67046* (2013.01); *A46B 13/008* (2013.01); *B08B 1/002* (2013.01); *B08B 1/04* (2013.01); *B08B 3/02* (2013.01); *B08B 11/02* (2013.01); *H01L 21/02065* (2013.01); *H01L 21/02074* (2013.01)

(58) Field of Classification Search
CPC . H01L 21/67046; A46B 13/008; B08B 11/00; B08B 11/02
USPC .................................. 15/77, 88.1, 88.2, 102
See application file for complete search history.

(56) References Cited

U.S. PATENT DOCUMENTS

| | | | | |
|---|---|---|---|---|
| 6,334,229 | B1 * | 1/2002 | Moinpour | H01L 21/67028 451/245 |
| 6,550,091 | B1 * | 4/2003 | Radman | B08B 1/04 15/88.1 |
| 6,910,240 | B1 * | 6/2005 | Boyd | H01L 21/67046 |
| 2005/0087212 | A1 * | 4/2005 | Yudovsky | H01L 21/67046 134/6 |
| 2005/0172430 | A1 * | 8/2005 | Yudovsky | B24B 9/065 134/6 |
| 2006/0243304 | A1 * | 11/2006 | Hsu | B08B 1/04 134/21 |

\* cited by examiner

*Primary Examiner* — Randall E Chin
(74) *Attorney, Agent, or Firm* — ScienBiziP, P.C.

(57) ABSTRACT

The present disclosure provides a roller for cleaning a backside of a wafer. The backside of the wafer has a central region and a periphery region surrounding the central region. The roller includes an upper element, a bottom element, and an axis element for connecting the upper element and the bottom element. The upper element of the roller is configured to contact with a frontside of the wafer. The bottom element is configured to contact with the backside of the wafer and remove particles from the periphery region of the backside of the wafer. The bottom element is made of materials selected from a group comprising abrasive pads, sand papers, and asbestos.

16 Claims, 7 Drawing Sheets

S200

S201
Loading the wafer to a cleaning apparatus, wherein the cleaning apparatus comprises a frontside brush, a backside brush, and at least one roller, the roller has a bottom element made of materials selected from a group comprising abrasive pad, sand paper, and asbestos S202
Brushing a frontside of the wafer by the frontside brush of the cleaning apparatus S203
Brushing a backside of the wafer by the backside brush of the cleaning apparatus S204
Removing particles from a periphery region of the backside of the wafer by the bottom element of the roller of the cleaning apparatus S205
Providing deionized water by a water spray unit of the cleaning apparatus to the frontside and the backside of the wafer to clean the wafer

S301
Loading the wafer to a cleaning apparatus, wherein the cleaning apparatus comprises a frontside brush, a backside brush, and at least one roller, the roller has a bottom element comprising a main portion and an abrasive portion disposed on the main portion

S302
Brushing a frontside of the wafer by the frontside brush of the cleaning apparatus

S303
Brushing a backside of the wafer by the backside brush of the cleaning apparatus

S304
Removing particles from a periphery region of the backside of the wafer by the abrasive portion of the bottom element of the roller

S305
Providing deionized water by a water spray unit of the cleaning apparatus to the frontside and the backside of the wafer to clean the wafer

FIG. 3

ROLLER FOR CLEANING WAFER AND CLEANING APPARATUS HAVING THE SAME

CROSS-REFERENCE TO RELATED APPLICATION

This application claims the benefit of and priority to U.S. Provisional Patent Application No. 62/784,762 filed on Dec. 25, 2018, the contents of which are incorporated fully by reference herein.

FIELD

The present disclosure generally relates to a roller for cleaning a wafer and a cleaning apparatus having the same. More specifically, the present disclosure relates to a roller that includes abrasive materials on its bottom element to remove particles from a backside of the wafer.

BACKGROUND

A chemical mechanical polishing or chemical mechanical planarization (CMP) process is accomplished by holding a semiconductor wafer [A1]against a rotating polishing surface, or moving the wafer relative to the polishing surface, under controlled conditions of temperature, pressure, and chemical composition. The polishing surface, which may be a planar pad formed of a relatively soft and porous material (e.g., a blown polyurethane), is soaked with a chemically reactive and abrasive aqueous slurry. The aqueous slurry, which may be either acidic or basic, typically includes abrasive particles, reactive chemical agents such as a transition metal chelated salt or an oxidizer, and adjuvants such as solvents, buffers, and passivating agents. In such a slurry, salt or other agents may facilitate chemical etching actions, while the abrasive particles and the polishing pad together may facilitate mechanical polishing actions.

The CMP process is becoming the main planarization technique for planarizing both dielectric and metal layers. For the CMP of a dielectric layer, such as borophosphosilicate glass (BPSG), borophosphorous tetraethyl orthosilicate (BPTEOS), and plasma-enhanced chemical vapor deposition (PECVD) oxides, a fumed silica-based slurry is normally used. Other types of slurries, such as dispersed silica, fumed and dispersed alumina, may also be used for CMP of both dielectric layers and metal layers (such as tungsten or titanium). When a CMP process is completed, the wafer's surfaces are covered in particles (referred to as slurry residues). At later actions in the process flow, if the slurry residues are allowed to be remained on or even redistributed across the surfaces of the wafer, contamination issue may occur, which would result in the loss in die yield and/or device performance. To prevent contamination, all surfaces of the wafer must be free of slurry residues after the CMP process by a post-CMP cleaning process.

Accordingly, there remains a need in the art to provide a cleaning device to improve the performance of the post-CMP cleaning process performed on a wafer.

SUMMARY

In view of above, an object of the present disclosure is to provide a roller and a cleaning apparatus to improve the performance of a post-CMP cleaning process of a wafer.

To achieve the above object, an implementation of the present disclosure provides a roller for cleaning a backside of a wafer. The backside of the wafer has a central region and a periphery region surrounding the central region. The roller includes an upper element, a bottom element, and an axis element for connecting the upper element and the bottom element. The upper element of the roller is configured to contact with a frontside of the wafer. The bottom element is configured to contact with the backside of the wafer and remove particles from the periphery region of the backside of the wafer. The bottom element is made of materials selected from a group comprising abrasive pads, sand papers, and asbestos.

To achieve the above object, another implementation of the present disclosure provides a roller for cleaning a backside of a wafer. The backside of the wafer has a central region and a periphery region surrounding the central region. The roller includes an upper element, a bottom element, and an axis element for connecting the upper element and the bottom element. The upper element of the roller is configured to contact with a frontside of the wafer. The bottom element is configured to contact with the backside of the wafer. The bottom element includes a main portion and an abrasive portion disposed on the main portion. The abrasive portion of the bottom element is configured to remove particles on the periphery region of the backside of the wafer. The abrasive portion of the bottom element is made of materials selected from a group comprising abrasive pads, sand papers, and asbestos.

To achieve the above object, yet another implementation of the present disclosure provides a cleaning apparatus for cleaning a wafer. The cleaning apparatus includes a frontside brush for brushing a frontside of the wafer, a backside brush for brushing a backside of the wafer, and at least one roller. The roller includes an upper element, a bottom element, and an axis element for connecting the upper element and the bottom element. The upper element of the roller is configured to contact with the frontside of the wafer. The bottom element is configured to contact with the backside of the wafer. The bottom element includes a main portion and an abrasive portion disposed on the main portion. The abrasive portion of the bottom element is configured to remove particles on a periphery region of the backside of the wafer. The abrasive portion of the bottom element is made of materials selected from a group comprising abrasive pads, sand papers, and asbestos.

As describe above, the roller and the cleaning apparatus of the implementations of the present disclosure includes abrasive materials on its bottom element. When the wafer is rotated by the roller, the abrasive materials on the bottom element of the roller can polish a periphery region of a backside of a wafer. Therefore, particles accumulated on the periphery region of the backside of the wafer can be removed without additional chemical cleaning processes or bevel CMP processes, and the performance of the post-CMP cleaning process is improved.

BRIEF DESCRIPTION OF THE DRAWINGS

Implementations of the present technology will now be described, by way of example only, with reference to the attached figures.

FIG. 2 is a flowchart of a method of cleaning a wafer according to an implementation of the present disclosure.

FIG. 3 is a flowchart of a method of cleaning a wafer according to an implementation of the present disclosure.

DETAILED DESCRIPTION

Figure 1A:
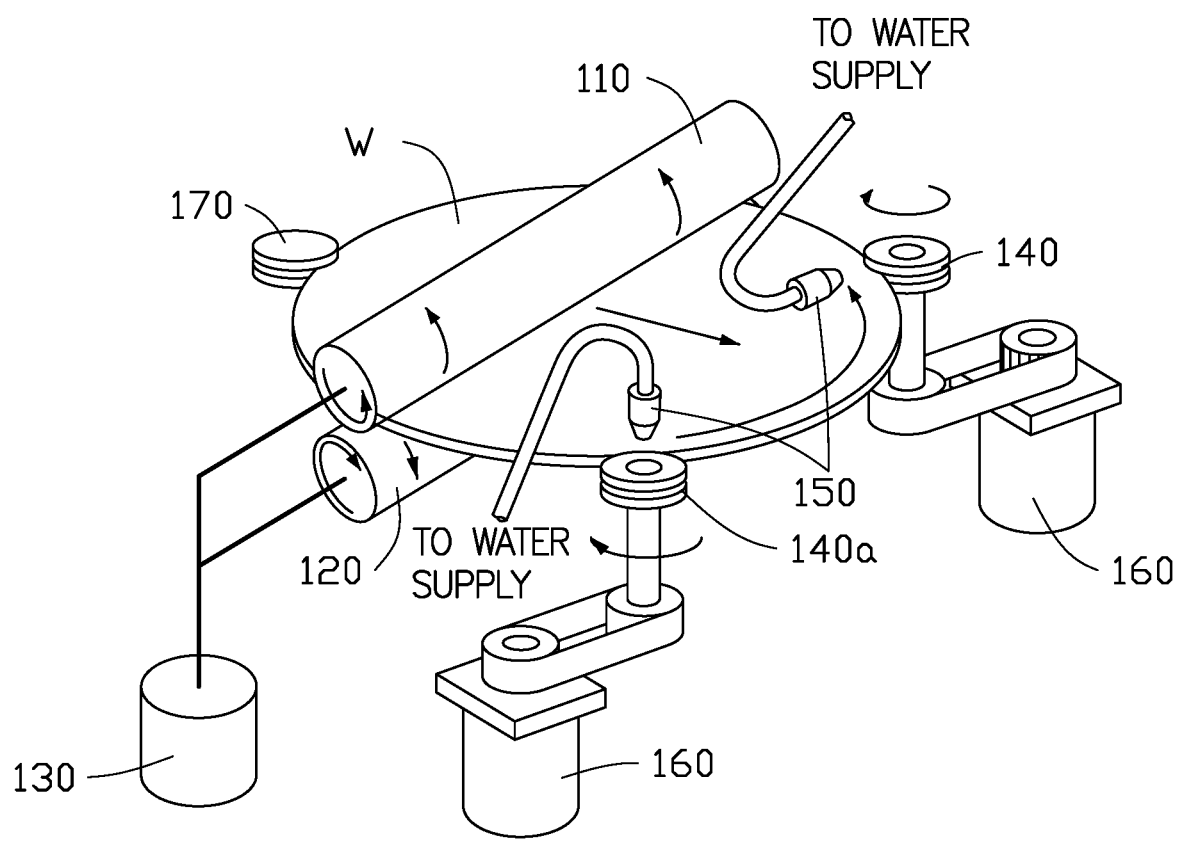
FIG. 1A is a schematic diagram of a cleaning apparatus for cleaning a wafer according to an implementation of the present disclosure.

The present disclosure will now be described more fully hereinafter with reference to the accompanying drawings, in which example implementations of the disclosure are shown. This disclosure may, however, be embodied in many different forms and should not be construed as limited to the example implementations set forth herein. Rather, these example implementations are provided so that this disclosure will be thorough and complete, and will fully convey the scope of the disclosure to those skilled in the art. Like reference numerals refer to like elements throughout.

The terminology used herein is for the purpose of describing particular example implementations only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, actions, operations, elements, and/or components, but do not preclude the presence or addition of one or more other features, regions, integers, actions, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, layer or section. Thus, a first element, component, region, part or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the example implementations of the present disclosure in conjunction with the accompanying drawings in FIGS. 1A through 3. Reference will be made to the drawing figures to describe the present disclosure in detail, wherein depicted elements are not necessarily shown to scale and wherein like or similar elements are designated by same or similar reference numeral through the several views and same or similar terminology.

The present disclosure will be further described hereafter in combination with the accompanying figures.

Referring to FIG. 1A, a schematic diagram of a cleaning apparatus 100 for cleaning a wafer W according to an implementation of the present disclosure is illustrated. The cleaning apparatus 100 is a double sided scrubber. The cleaning apparatus 100 is used to clean the wafer W after a chemical mechanical polishing (CMP) process (i.e., post-CMP cleaning process). In the cleaning apparatus 100, the wafer W is scrubbed simultaneously on both a frontside and a backside by brushes. The frontside of the wafer W includes a surface of the wafer W that is being processed (such as a surface that is planarized in a CMP process). The backside of the wafer W includes a surface of the wafer W that is opposite to the processed surface. After the CMP process, the frontside and the backside of the wafer W are covered by slurry residues including materials of a polishing slurry and materials (e.g., particles) of the wafer W that are removed by the CMP process. The slurry residues on the wafer W must be cleaned before subsequent processing of the wafer W to prevent contamination.

As shown in FIG. 1A, the cleaning apparatus 100 includes a frontside brush 110 for brushing the frontside of the wafer W, a backside brush 120 for brushing the backside of the wafer W, and at least one roller 140. When the wafer W is being cleaned, the wafer W is disposed between the frontside brush 110 and the backside brush 120. The backside brush 120 is beneath the wafer W and directly below the frontside brush 110. The cleaning apparatus 100 may further includes a brush motor 130, a roller motor 160, and one or more water spray units 150. The brush motor 130 is coupled to the frontside brush 110 and the backside brush 120 to rotate the frontside brush 110 and the backside brush 120. Each of the frontside brush 110 and the backside brush 120 is rotated about its central axis by the brush motor 130. The roller motor 160 is coupled to the roller 140 and configured to rotate the roller 140. The rotary motion of the roller 140 is transferred to the wafer W when the roller 140 comes into contact with an edge of the wafer W. As shown in FIG. 1A, two rollers 140 and 140a may be used to rotate the wafer W so that the entire wafer W may be cleaned. The water spray units 150 are configured to supply deionized water to clean the wafer W. The cleaning apparatus 100 may further includes an idler wheel 170 for monitoring a rotation speed of the wafer W.

Figure 1B:
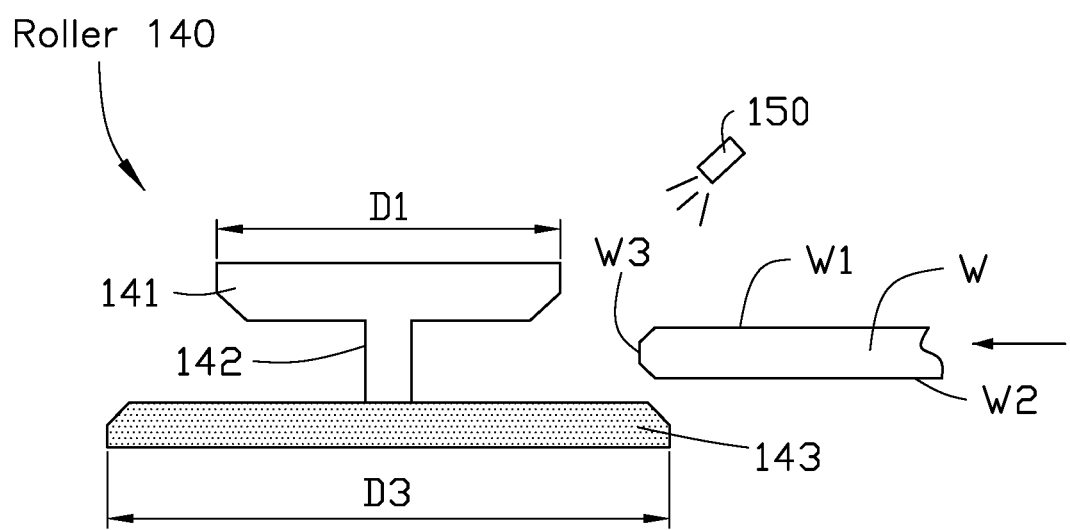
FIGS. 1B and 1C are cross-sectional views of implementations of a roller of the cleaning apparatus of FIG. 1A.
Figure 1C:
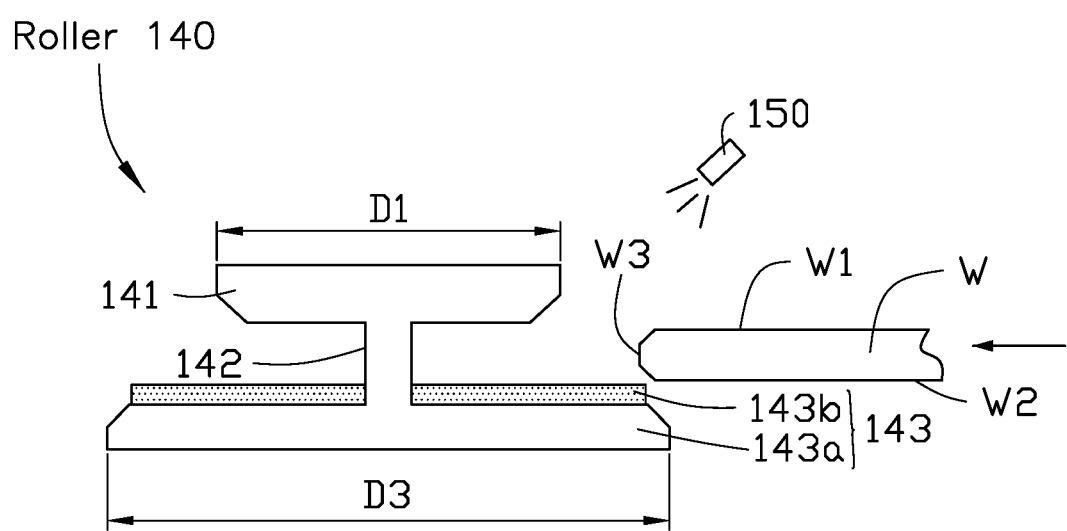
Figure 1D:
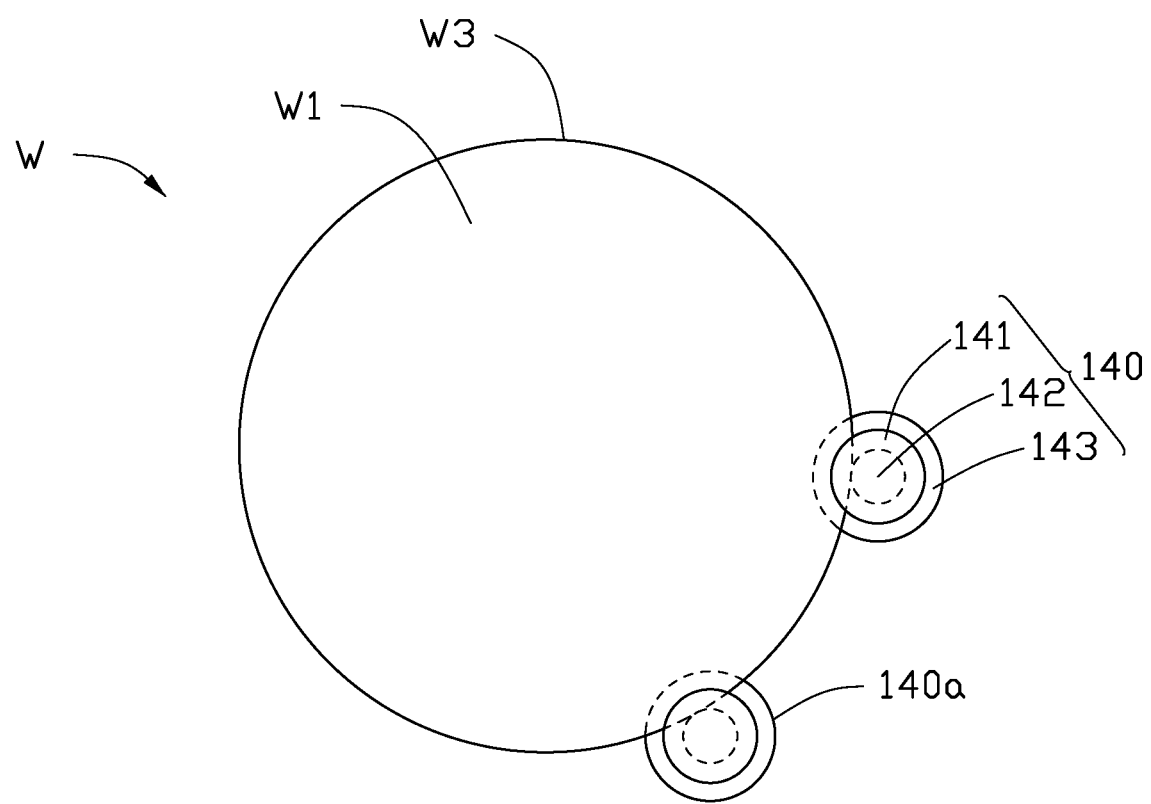
FIG. 1D is a top view of the wafer and the roller of the cleaning apparatus of FIG. 1A.
Figure 1E:
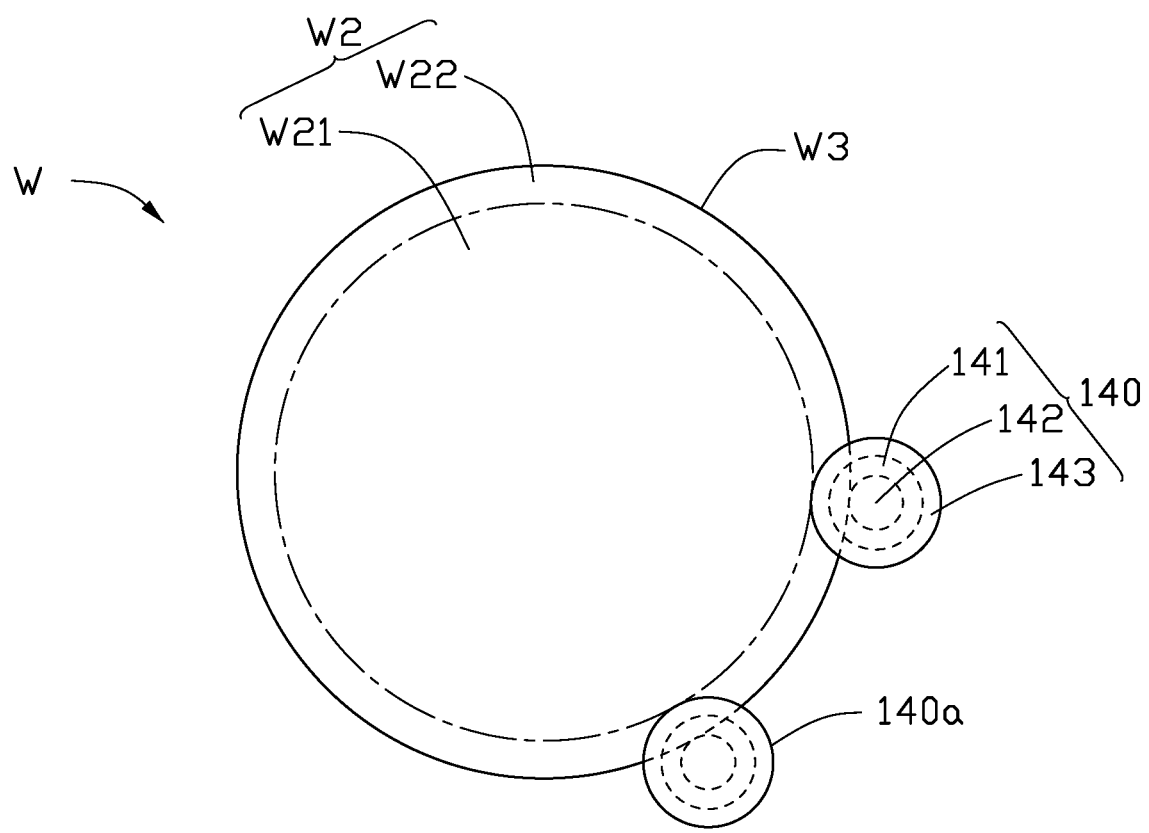
FIG. 1E is a bottom view of the wafer and the roller of the cleaning apparatus of FIG. 1A.

Referring to FIGS. 1B to 1E, FIGS. 1B and 1C are cross-sectional views of implementations of the roller 140; FIG. 1D is a top view of the wafer W and the roller 140; and FIG. 1E is a bottom view of the wafer W and the roller 140. The frontside of the wafer W is indicated as W1, the backside of the wafer W is indicated as W2, and the edge of the wafer W is indicated as W3. As shown in FIGS. 1B to 1E, the roller 140 is configured to clean, at least, the backside W2 of the wafer W. The backside W2 of the wafer W has a central region W21 and a periphery region W22 surrounding the central region W21. After a CMP process, most of the slurry residues are accumulated at the backside W2 of the wafer W. Particularly, metal particles or carbon particles in the slurry residues are likely to be attached at the periphery region W22 of the backside W2 of the wafer W. Each of the frontside brush 110 and the backside brush 120 includes a brush core and a brush pad covering an outer surface of the brush core. The brush pad of each of the frontside brush 110 and the backside brush 120 may include polyvinyl alcohol (PVA). The PVA brush pad may not have sufficient scrubbing power to completely remove the metal particles or carbon particles accumulated on the periphery region W22 of the backside W2 of the wafer W. Usually, an additional chemical cleaning process or a bevel CMP process may be required to remove the metal particles or carbon particles attached at the periphery region W22 of the backside W2 of the wafer W.

The roller 140 of the cleaning apparatus 100 includes an upper element 141, a bottom element 143, and an axis element 142. The upper element 141 of the roller 140 is configured to contact with the frontside W1 of the wafer W. The bottom element 143 of the roller 140 is configured to contact with the backside W2 of the wafer W and remove particles from the periphery region W22 of the backside W2 of the wafer W. The axis element 142 of the roller 140 connects the upper element 141 and the bottom element 143, and is configured to contact with the edge W3 of the wafer W. The roller 140 is disposed adjacent to the edge W3 of the wafer W, and rotates about a center line of the axis element 142 to rotate the wafer W when in contact with the edge W3. Specifically, when the wafer W is fitted into a space formed between the upper element 141 and the bottom element 143 of the roller 140, a bottom surface of the upper element 141 contacts the frontside W1 of the wafer W, a side surface of the axis element 142 contacts the edge W3 of the wafer W, and an upper surface of the bottom element 143 contacts the backside W2 of the wafer W. By utilizing the friction between the roller 140 and the wafer W, the wafer W is driven to rotate by the rotary motion of the roller 140. Each of the upper element 141 and the bottom element 143 may have a disc-like shape. The bottom element 143 has a diameter D3 greater than a diameter D1 of the upper element 141. The axis element 142 may have a shape of a cylinder. The upper surface of the bottom element 143 of the roller 140 in contact with the backside W2 of the wafer W is abrasive, and therefore provides polishing functions to the backside W2 of the wafer W to remove the particles accumulated thereon.

As shown in FIG. 1B, in some implementations, the bottom element 143 of the roller 140 is made of materials such as abrasive pads, sand papers, and asbestos. The upper element 141 and the axis element 142 of the roller 140 may be integrally made of polyurethane as one piece. When the wafer W is rotated, the upper surface of the bottom element 143 of the roller 140 polishes the periphery region W22 of the backside W2 of the wafer W to remove the particles accumulated thereon.

As shown in FIG. 1C, in some implementations, the bottom element 143 of the roller 140 includes a main portion 143a and an abrasive portion 143b disposed on the main portion 143a. The abrasive portion 143b of the bottom element 143 is configured to remove the particles on the periphery region W22 of the backside W2 of the wafer W. The abrasive portion 143b of the bottom element 143 is made of materials such as abrasive pads, sand papers, and asbestos. The main portion 143a of the bottom element 143, the upper element 141, and the axis element 142 may be integrally made of polyurethane as one piece. When the wafer W is rotated, the upper surface of the abrasive portion 143b of the bottom element 143 polishes the periphery region W22 of the backside W2 of the wafer W to remove the particles accumulated thereon.

As shown in FIGS. 1A, 1D and 1E, the cleaning apparatus may include two rollers 140 and 140a. The structure of the roller 140 is described herein above. In some implementations, the other roller 140a may have an identical or substantially similar structure to the roller 140. In some implementations, the entire roller 140a may be made by plastic such as polyurethane, so that the roller 140a may rotate the wafer W while the roller 140 performs both rotating and polishing functions. In some implementations, the roller 140 may be stationary and only perform the function of polishing the periphery region W22 of the backside W2 of the wafer W, while the roller 140a is responsible for rotating the wafer W.

Referring to FIG. 2, a flowchart of a method S200 of cleaning a wafer according to an implementation of the present disclosure is illustrated. As shown in FIG. 2, the method S200 includes actions S201 to S205. In action S201, a wafer is loaded to a cleaning apparatus. The cleaning apparatus may correspond to the cleaning apparatus 100 illustrated in FIGS. 1A and 1B. The cleaning apparatus 100 includes the frontside brush 110, the backside brush 120, and at least one roller 140. As shown in FIG. 1B, the roller 140 includes the upper element 141, the bottom element 143, and the axis element 142. The bottom element 143 of the roller 140 may be made of materials such as abrasive pads, sand papers, and asbestos. The upper element 141 and the axis element 142 of the roller 140 may be integrally made of polyurethane. The bottom element 143 has a diameter D3 greater than a diameter D1 of the upper element 141. Each of the upper element 141 and the bottom element 143 has a disc-like shape. The cleaning apparatus 100 may further includes the brush motor 130, the roller motor 160, and the water spray unit 150. The wafer W is disposed between the frontside brush 110 and the backside brush 120. The backside brush 120 is beneath the wafer W and directly below the frontside brush 110.

In action S202, the frontside W1 of the wafer W is brushed by the frontside brush 110 of the cleaning apparatus 100. In action S203, the backside W2 of the wafer W is brushed by the backside brush 120 of the cleaning apparatus 100. In action S204, the bottom element 143 of the roller 140 of the cleaning apparatus 100 removes particles from the periphery region W22 of the backside W2 of the wafer W. In action S205, the water spray unit 150 of the cleaning apparatus 100 provides deionized water to the frontside W1 and the backside W2 of the wafer W to clean the wafer W. For example, each of water spray units 150 may spray (or pressurized spray) deionized water to the surfaces of the wafer W through a nozzle that is connected to a water supply via a water tube. When the wafer W is being cleaned, the frontside brush 110 and the backside brush 120 of the cleaning apparatus 100 rotate to respectively brush the frontside W1 and the backside W2 of the wafer W. Also, the wafer W is rotated so that the entirely wafer W may be brushed by the frontside brush 110 and the backside brush 120. The wafer may be rotated by the roller 140 and/or another roller 140a of the cleaning apparatus. When the wafer W is rotated, the bottom element 143 of the roller 140 contacts with the periphery region W22 of the backside W2 of the wafer W. Since the bottom element 143 of the roller 140 is made of abrasive materials (e.g., abrasive pads, sand papers, asbestos, etc.), particles accumulated on the periphery region W22 of the backside W2 of the wafer W can be removed by the bottom element 143 of the roller 130 when the wafer W is rotating.

Referring to FIG. 3, a flowchart of a method S300 of cleaning a wafer according to an implementation of the present disclosure is illustrated. As shown in FIG. 3, the method S300 includes actions S301 to S305. In action S301, a wafer is loaded to a cleaning apparatus. The cleaning apparatus may correspond to the cleaning apparatus 100 illustrated in FIGS. 1A and 1C. The cleaning apparatus 100 includes the frontside brush 110, the backside brush 120, and at least one roller 140. As shown in FIG. 1C, the roller 140 includes the upper element 141, the bottom element 143, and the axis element 142. The bottom element 143 of the roller 140 includes the main portion 143a and the abrasive portion 143b disposed on the main portion 143a. The abrasive portion 143b of the bottom element 143 may be made of materials such as abrasive pads, sand papers, and asbestos. The main portion 143a of the bottom element 143, the upper element 141, and the axis element 142 of the roller 140 may be integrally made of polyurethane. The bottom element 143 has a diameter D3 greater than a diameter D1 of the upper element 141. Each of the upper element 141 and the bottom element 143 has a disc-like shape. The cleaning apparatus 100 may further includes the brush motor 130, the roller motor 160, and the water spray unit 150. The wafer W is disposed between the frontside brush 110 and the backside brush 120. The backside brush 120 is beneath the wafer W and directly below the frontside brush 110.

In action S302, the frontside W1 of the wafer W is brushed by the frontside brush 110 of the cleaning apparatus 100. In action S303, the backside W2 of the wafer W is brushed by the backside brush 120 of the cleaning apparatus 100. In action S304, the abrasive portion of the bottom element 143 of the roller 140 removes particles from the periphery region W22 of the backside W2 of the wafer W. In action S305, the water spray unit 150 of the cleaning apparatus 100 provides deionized water to the frontside W1 and the backside W2 of the wafer W to clean the wafer W. For example, the water spray unit 150 may spray (or pressurized spray) deionized water through a nozzle that is connected to a water supply via a water tube. When the wafer W is being cleaned, the frontside brush 110 and the backside brush 120 of the cleaning apparatus 100 rotate to respectively brush the frontside W1 and the backside W2 of the wafer W. Also, the wafer W is rotated so that the entirely wafer W may be brush by the frontside brush 110 and the backside brush 120. The wafer may be rotated by the roller 140 and/or another roller 140a of the cleaning apparatus. When the wafer W is rotated, the abrasive portion 143b of the bottom element 143 of the roller 140 contacts with the periphery region W22 of the backside W2 of the wafer W. Since the abrasive portion 143b of the bottom element 143 of the roller 140 is made of abrasive materials (e.g., abrasive pads, sand papers, asbestos, etc.), particles accumulated on the periphery region W22 of the backside W2 of the wafer W can be removed by the abrasive portion 143b of the bottom element 143 of the roller when the wafer W is rotating.

According to still another implementation, the present disclosure also provides a roller for cleaning a wafer. The roller may correspond to the roller 140 illustrated in FIG. 1B. As shown in FIG. 1B, the roller 140 is configured to clean the backside W2 of the wafer W. The backside W2 of the wafer W has the central region W21 (shown in FIG. 1E) and the periphery region W22 (shown in FIG. 1E) surrounding the central region. The roller 140 includes the upper element 141, the bottom element 143, and the axis element 142 for connecting the upper element 141 and the bottom element 143. The upper element 141 of the roller is configured to contact with the frontside W1 of the wafer W. The bottom element 143 is configured to contact with the backside W2 of the wafer W and remove particles from the periphery region of the backside W2 of the wafer W. The bottom element 143 is made of abrasive materials (e.g., abrasive pads, sand papers, asbestos, etc.).

According to still another implementation, the present disclosure also provides a roller for cleaning a wafer. The roller may correspond to the roller 140 illustrated in FIG. 1C. As shown in FIG. 1C, the roller 140 is configured to clean the backside W2 of the wafer W The backside W2 of the wafer W has the central region W21 (shown in FIG. 1E) and the periphery region W22 (shown in FIG. 1E) surrounding the central region. The roller 140 includes the upper element 141, the bottom element 143, and the axis element 142 for connecting the upper element 141 and the bottom element 143. The upper element 141 of the roller is configured to contact with the frontside W1 of the wafer W. The bottom element 143 is configured to contact with the backside W2 of the wafer W. The bottom element 143 includes the main portion 143a and the abrasive portion 143b disposed on the main portion 143a. The abrasive portion 143b of the bottom element 143 is configured to remove particles on the periphery region W22 of the backside W2 of the wafer W. The abrasive portion 143b of the bottom element 143 is made of abrasive materials (e.g., abrasive pads, sand papers, asbestos, etc.).

As describe above, the roller of the implementations of the present disclosure includes abrasive materials on its bottom element. When the wafer is rotated by the roller, the abrasive materials on the bottom element of the roller can polish a periphery region of a backside of a wafer. Therefore, particles accumulated on the periphery region of the backside of the wafer can be removed without additional chemical cleaning processes or bevel CMP processes, and the performance of the post-CMP cleaning process is improved.

The implementations shown and described above are only examples. Many details are often found in the art such as the other features of a roller for cleaning a wafer and a cleaning apparatus having the same. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the implementations described above may be modified within the scope of the claims.

What is claimed is:

1. A roller for cleaning a backside of a wafer, wherein the backside of the wafer has a central region and a periphery region surrounding the central region, the roller comprising:
    an upper element configured to contact with a frontside of the wafer;
    a bottom element configured to contact with the backside of the wafer and remove particles from the periphery region of the backside of the wafer, wherein the bottom element is made of materials selected from a group comprising abrasive pads, sand papers, and asbestos; and
    an axis element for connecting the upper element and the bottom element;
    wherein the bottom element has a diameter greater than a diameter of the upper element.

2. The roller of claim 1, wherein the upper element and the axis element are made of polyurethane.

3. The roller of claim 1, wherein the axis element is configured to contact with an edge of the wafer.

4. The roller of claim 1, wherein each of the upper element and the bottom element has a disc-like shape.

5. The roller of claim 1, wherein the roller is further configured to rotate about a center line of the axis element to rotate the wafer.

6. A roller for cleaning a backside of a wafer, wherein the backside of the wafer has a central region and a periphery region surrounding the central region, the roller comprising:
- an upper element configured to contact with a frontside of the wafer;
- a bottom element configured to contact with the backside of the wafer, wherein the bottom element comprises a main portion and an abrasive portion disposed on the main portion, and the abrasive portion is configured to remove particles on the periphery region of the backside of the wafer; and
- an axis element for connecting the upper element and the bottom element;
- wherein the bottom element has a diameter greater than a diameter of the upper element.

7. The roller of claim 6, wherein an abrasive portion of the bottom element is made of materials selected from a group comprising abrasive pads, sand papers, and asbestos.

8. The roller of claim 6, wherein a main portion of the bottom element, the upper element, and the axis element are made of polyurethane.

9. A cleaning apparatus for cleaning a wafer, comprising:
- a frontside brush for brushing a frontside of the wafer;
- a backside brush for brushing a backside of the wafer; and
- at least one roller comprising:
- an upper element configured to contact with the frontside of the wafer;
- a bottom element configured to contact with the backside of the wafer, wherein the bottom element comprises a main portion and an abrasive portion disposed on the main portion, and the abrasive portion is configured to remove particles from a periphery region of the backside of the wafer; and
- an axis element for connecting the upper element and the bottom element;
- wherein the bottom element of the roller has a diameter greater than a diameter of the upper element.

10. The cleaning apparatus of claim 9, wherein the abrasive portion of the bottom element of the roller is made of materials selected from a group comprising abrasive pads, sand papers, and asbestos.

11. The cleaning apparatus of claim 9, wherein the main portion of the bottom element, the upper element, and the axis element of the roller are made of polyurethane.

12. The cleaning apparatus of claim 9, wherein the at least one roller is configured to rotate the wafer.

13. The cleaning apparatus of claim 9, further comprising a brush motor coupled to the frontside brush and the backside brush to rotate the frontside brush and the backside brush.

14. The cleaning apparatus of claim 9, further comprising a water spray unit configured to supply deionized water to the wafer.

15. The cleaning apparatus of claim 9, further comprising a roller motor coupled to the at least one roller and configured to rotate the at least one roller.

16. The cleaning apparatus of claim 9, further comprising an idler wheel for monitoring a rotation speed of the wafer.

* * * * *